US006169295B1

(12) United States Patent
Koo

(10) Patent No.: US 6,169,295 B1
(45) Date of Patent: Jan. 2, 2001

(54) INFRARED TRANSCEIVER MODULE AND METHOD FOR MAKING SAME

(75) Inventor: Ronald B. Koo, Mt. View, CA (US)

(73) Assignee: Maxim Integrated Products, Inc.

( * ) Notice: Under 35 U.S.C. 154(b), the term of this patent shall be extended for 0 days.

(21) Appl. No.: 09/087,384

(22) Filed: May 29, 1998

(51) Int. Cl.$^7$ .................................................. H01L 33/00
(52) U.S. Cl. .................. 257/81; 257/82; 257/84; 257/85; 257/98; 257/99; 257/100; 257/432; 257/433; 438/25; 438/26; 438/27; 438/28; 438/29
(58) Field of Search .................. 257/80, 81, 82, 257/84, 85, 98, 99, 100, 432, 433, 434; 438/25, 26, 27, 28, 29

(56) References Cited

U.S. PATENT DOCUMENTS

| 3,881,113 | * | 4/1975 | Rideout et al. | 250/551 |
|---|---|---|---|---|
| 4,058,821 | * | 11/1977 | Miyoshi et al. | 357/19 |
| 4,851,695 | * | 7/1989 | Stein | 250/551 |
| 4,906,839 | * | 3/1990 | Lee | 250/239 |
| 5,382,810 | * | 1/1995 | Isaksson | 257/81 |
| 5,506,445 | | 4/1996 | Rosenberg | 257/666 |
| 5,668,383 | | 9/1997 | Krieger | 257/80 |
| 5,753,928 | * | 5/1998 | Krause | 250/551 |
| 5,920,587 | * | 7/1999 | Narui et al. | 372/50 |

FOREIGN PATENT DOCUMENTS

| 363016682 | * | 1/1988 | (JP) . |
| 363065683 | * | 3/1988 | (JP) . |
| 363073678 | * | 4/1998 | (JP) . |
| 410242506 | * | 9/1998 | (JP) . |

* cited by examiner

Primary Examiner—William Mintel
(74) Attorney, Agent, or Firm—Hickman Coleman & Hughes, LLP

(57) ABSTRACT

An IR transceiver module includes a lead frame, a sensor, an emitter, and a body encapsulating the sensor and emitter, where the body has an integrally formed lens aligned with both the sensor and with the emitter. The sensor is supported proximate to a support surface of the lead frame and has a sensing area which is generally parallel to the support surface. The emitter is supported proximate to the sensor and within a vertical projection of the sensing area, i.e. it is vertically aligned with the sensor. In embodiments of the invention, a recess is formed into the sensing surface of the sensor that is provided with a reflective material to form a reflective cup for the emitter. In other embodiments, a transceiver is also supported proximate to the lead frame and is electrically coupled to both the sensor and the emitter. By providing a module having both the emitter and sensor aligned with a single lens, a very small form factor can be achieved.

18 Claims, 7 Drawing Sheets

INFRARED TRANSCEIVER MODULE AND METHOD FOR MAKING SAME

BACKGROUND OF THE INVENTION

This invention relates generally to infrared (IR) sensors and transmitters, and more particularly to integrated IR transceiver modules.

Infrared transceivers are being used for an increasing number of data communication applications. For example, IR transceiver modules are used to couple laptop computers and personal information managers (PIMs) to IR ports of printers. Also, an increasing number of portable computer and PIM systems include IR transceiver modules to provide inter-computer and inter-PIM data transfers.

An IR transceiver module typically includes an IR PIN (p-intrinsic-n) diode for a sensor, and an IR light emitting diode (LED) as an emitter. Associated with the sensor is receiver circuitry, and associated with the emitter is transmission circuitry. When the receiver circuitry and transmitter circuitry are integrated together on an integrated circuit (IC), the circuitry is typically referred to as a "transceiver" IC or, simply, a "transceiver."

While the sensor, emitter, and transceiver of an IR transceiver system can be provided as separate components, it is often desirable to have these components combined into a single package or "module" to save space. Such IR transceiver modules are well known and are commercially available from a number of sources. By combining the various components of the IR transceiver system into a single module, the size or "form factor" of the system can be considerably reduced. In addition, the modules tend to be more durable and often consume less power than equivalent structures formed with the discrete components.

In FIG. 1, an IR transceiver module 10 of the prior art includes a unitary, plastic body 12, defining lenses 14 and 16 and provided with a number of electrical leads or contacts 18. A typical length "L" for the body 12 is approximately 10 mm, a typical width "W" is 4 mm, and a typical height "H" to the top of the lenses 14 and 16 is approximately 5 mm. It will therefore be appreciated that the IR transceiver module 10 possesses a quite small "form factor", as compared to providing the same functionality with discrete components.

In FIG. 2, a cross-sectional view taken along line 2—2 of FIG. 1 illustrates some of the internal components of the IR transceiver module 10. The IR transceiver module typically includes a lead frame 20, an IR sensor 22, a transceiver IC 24, and an IR LED 26. The body 12 encapsulates these components and provides the lens 14 aligned with the sensor 22 and the lens 16 aligned with the LED 26. Typically, the plastic material of body 12 includes a black dye which blocks visible light, but which allows infrared light to pass through.

The lenses 14 and 16 do not have to be terribly precise, since they are not used for imaging purposes. Rather, lens 14 is used to generally direct IR light 28 towards the active or sensing surface of the sensor 22. The lens 16 is used to partially focus the IR light 30 produced by the LED 26 in a direction generally perpendicular to the major surfaces of the IR transceiver module 10. To further aid in the directing of the IR light 30, the lead frame 20 is bent into a "cup" shape 32 which acts as a reflector for the IR light produced by the LED 26. This is useful since LEDs tend to generate IR light over a broad emission angle, much of which would be wasted if not reflected by the walls of the cup 32 in the desired direction.

An IR transceiver module similar to the one discussed with reference to FIGS. 1 and 2 is described in U.S. Pat. No. 5,506,445 of Rosenberg. An alternative but similar design is described in U.S. Pat. No. 5,668,383 of Kriger.

The IR transceiver modules of the prior art are typically designed to conform with the Infrared Data Association (IrDA) standards. For example, IR transceiver modules made by some of the largest manufacturers in the field, including the Hewlett-Packard Company of Palo Alto, Calif., Nippon Electric Company (NEC) of Japan, Sharp Corporation of Japan, and Temic Telefunken Microelectronic, GmbH, of Heilbronn, Germany all produce IR transceiver modules conforming to IrDA standards. These standards include minimum data rates, minimum transmission and reception distances, minimum lumens, etc. for the IR transceiver modules.

While IrDA specifications are useful for standardization purposes, these requirements tend to limit the miniaturization of the IR transceiver modules. For example, the IrDA standards require that the modules be able to transmit light and receive light over a distance of one meter, which requires that an IR sensor 22 be of a certain size, and that the IR LED 26 be of a certain power. In addition, the transceiver 24 must be able to create approximately 150 milliamperes of power to drive the IR LED 26 in order to meet these standards. In addition, the distance and light requirements of the IrDA standards also tends to require the dual lenses 14 and 16 such that the lenses can be optimized for receiving the IR light 28 for the sensor 22 and for transmitting the IR light 30 for the LED 26. These factors tend to require the separation of the components 22, 24, and 26 as illustrated in FIG. 2, increasing the form factor of the modules.

It will therefore be appreciated that there exists a need for an IR transceiver module that may not meet IrDA specifications but which has an extremely small form factor. Such an IR transceiver would be useful for applications where the stringent IrDA specifications are not required, but very small size is important.

SUMMARY OF THE INVENTION

In the present invention, an IR transceiver module having a very small form factor is provided with a body having a single lens shared by both the sensor and the emitter. Since the emitter is typically much smaller than the sensor, it can be placed on top of or within a sensing area of the sensor in alignment with the optical axis of the lens. These very small form factor IR transceiver modules can be used in application where small form factors are more important than meeting IrDA standards.

More particularly, an IR transceiver module of the present invention includes a lead frame, a sensor supported near a support surface of the lead frame, an emitter supported near the sensor and within the sensing area of the sensor, and a body encapsulating the sensor and the emitter. The body has an integral lens that is aligned both with the sensing area of the sensor and with the emitter. In several embodiments of the present invention, a transceiver integrated circuit is used to mechanically and electrically couple the sensor to the lead frame. The emitter is then mounted on the sensor within its sensing area.

In certain embodiments of the present invention, a recess is formed in the sensor to receive the emitter. The recess can extend partially through the sensor or can extend completely through the sensor. Preferably, a metal is deposited on the inner wall of the recess to form a "cup" to help direct the IR beam developed by the emitter.

An IR transceiver module as defined by the specification and drawings, and structural equivalence thereof, includes lead frame means, sensor means coupled to the lead frame means and defining an optical axis, emitter means coupled to the sensor means in alignment with the optical axis, and encapsulation means having an integral lens aligned with the optical axis. Preferably, the optical transceiver module further includes transceiver means coupling the sensor means to the lead frame means.

A method for making an IR transceiver module includes the operations of providing a lead frame, coupling a sensor having a sensing area to the lead frame, locating an emitter within the sensing area of the sensor, and encapsulating the sensor and emitter within a plastic body provided with an integral lens aligned with both the sensor and emitter. In one embodiment of the present invention the method further includes the operation of forming a recess within the sensor that is receptive to the emitter, and providing a reflective coating on the inner walls of the recess. In certain embodiments, the sensor is coupled to the lead frame with a transceiver IC, and in other embodiments of the invention the sensor is directly coupled to the lead frame.

By stacking the emitter on top of the sensor, and by providing a single lens for both the sensor and the emitter, the form factor of the optical transceiver module is greatly reduced. This results in a module which can be used where very small form factors are required. The form factor can be even further reduced (or the price of the module reduced) with embodiments of the present invention that are not in full compliance with IrDA standards.

These and other advantages of the present invention will become apparent to those skilled in the art upon a reading of the following descriptions of the invention and a study of the several figures of the drawing.

DETAILED DESCRIPTION OF THE PREFERRED EMBODIMENTS

Figure 1:
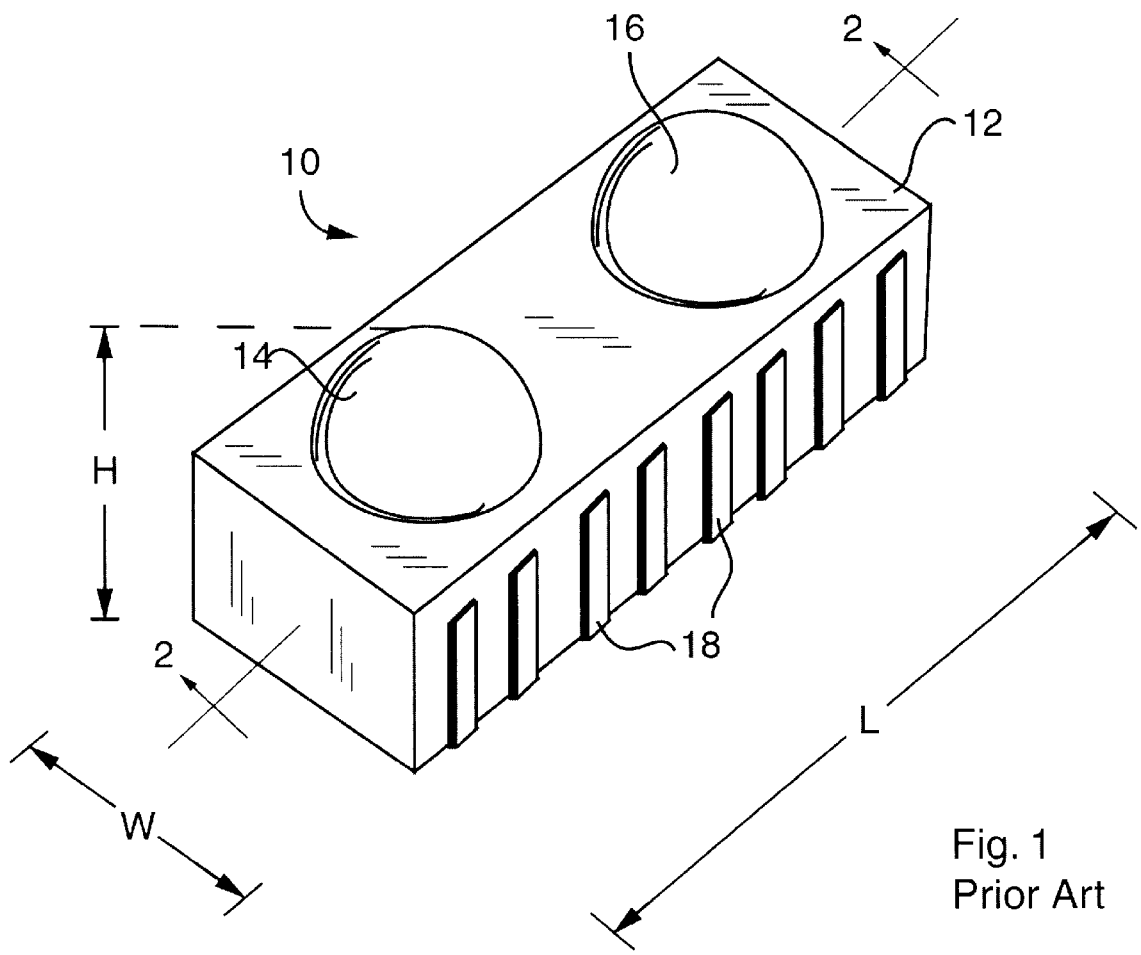
FIG. 1 is a perspective view of an IR transceiver module of the prior art.
Figure 2:
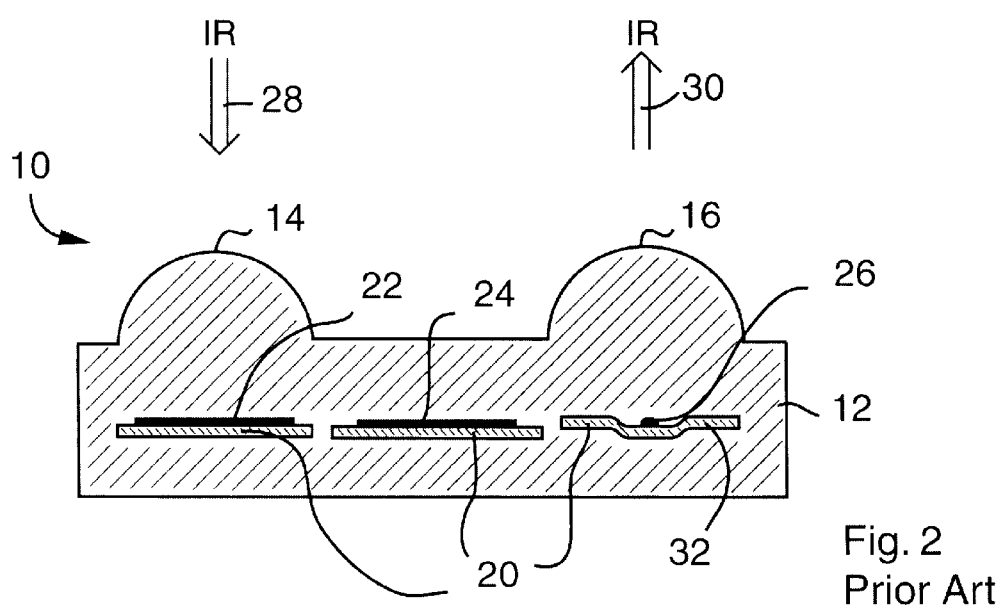
FIG. 2 is a cross-sectional view taken along line 2—2 of FIG. 1.
Figure 3:
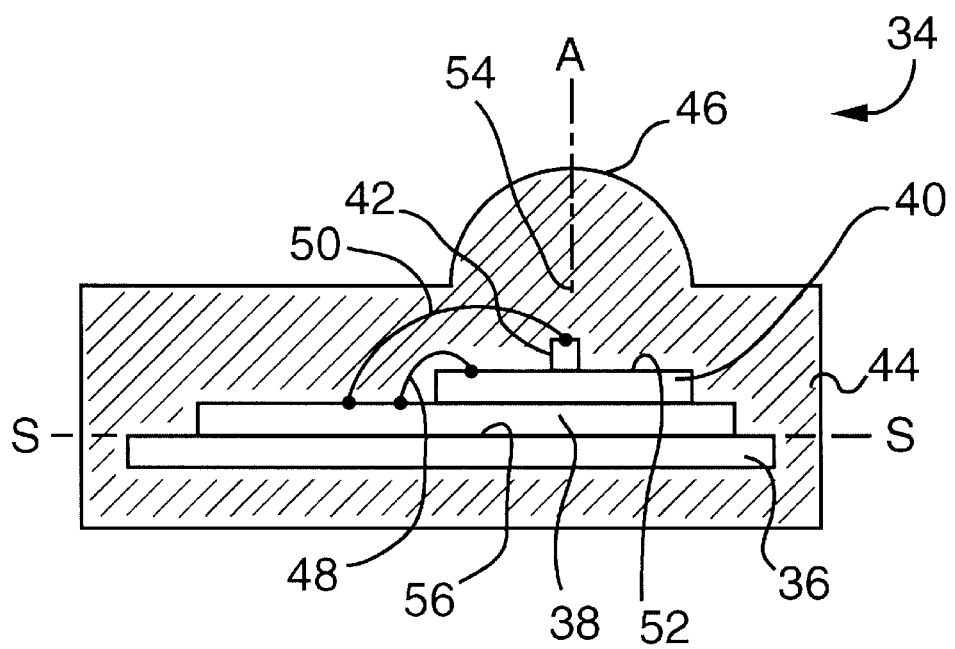
FIG. 3 is a cross-sectional view of a first embodiment of an IR transceiver module in accordance with the present invention.

FIGS. 1–2 were described with reference to the prior art. In FIG. 3, an IR transceiver module 34 in accordance with the present invention includes a lead frame 36, a transceiver 38, a sensor 40, and an emitter 42. The lead frame 36, transceiver 38, sensor 40 and emitter 42 are encapsulated within a plastic body 44 having an integrally formed lens 46. The formation of the lead frames 36, transceivers 38, sensors 40, and emitters 42, and plastic bodies 44, are well known to those skilled in the art.

The lead frame 36 is preferably a commercially available lead frame having an integrated circuit support pad, bonding fingers, leads, etc. Such lead frames are available from a number of vendors as both standard and custom parts. The leads of the lead frames extend out of the bodies 44 (not seen) to form electrical leads similar to those shown in FIG. 1. The transceiver 38 is an integrated circuit having input circuitry (e.g. pre-amplifiers) responsive to the output of sensor 40 and having output circuitry (e.g. drivers) connected to the emitter 42, as is well known to those skilled in the art. The receiving portion of the circuitry of transceiver 38 converts the output signals of sensor 40 to a digital (i.e. an on/off) signal for processing by a digital apparatus such as a computer or PIM. The transmission portion of the transceiver 38 provides digital pulses to the emitter 42 to produce a digitally encoded IR transmission beam. The transceiver 38 can be electrically coupled to the sensor 40 and emitter 42 by a variety of methods well known to those skilled in the art including flip-chip connections and by gold-ball bonding of, for example, wires 48 and 50. The illustrated wires are, of course, meant as a representation of wiring between the components, and additional such wires may be used for a complete connection.

The sensor 40 is preferably a PIN diode having a sensing surface or "sensing area" 52. The sensor 40, like the transceiver IC 38, is typically square or rectangular in shape. The emitter 42 is preferably centrally located within the sensing area 52 of the sensor 40.

The emitter 42 is, in a preferred embodiment of the present invention, an infrared LED. In an alternative preferred embodiment, the emitter 42 is a small laser, such as a vertical cavity surface emitting laser (VCSEL). The advantage of VCELSs is that they produce a beam from a top surface 54 which projects vertically in a collimated fashion. However, such devices are still relatively expensive and exhibit certain technical difficulties as compared with conventional IR LEDs.

With continuing reference to FIG. 3, the lead frame 38 includes a support surface 56 which defines a support surface plane "S." Preferably, the sensor 40 and the emitter 42 are aligned with an optical axis "A" which is substantially perpendicular to the plane S. That is, a central axis of the sensor 40 and a central axis of the emitter 42 are preferably aligned with the optical axis A. This optical axis A is also aligned with the center of the lens 46 for maximum transmission and reception efficiency.

By "within the sensing area", it is meant herein that the emitter is vertically aligned with the sensing surface of the sensor. That is, the emitter is within a vertical projection of the sensing surface along the optical axis A. The emitter may be "stacked upon" the sensing surface, or may reside within a recess formed into the sensing surface. In any event, the emitter is "within the sensing area" of the sensor such that both the emitter and the sensor can share a common lens.

While it is illustrated that the emitter 42 is centrally located along the sensing area 52 of sensor 40, other embodiments of the present invention have the emitter 42 offset from the center of the sensing area 52. This may be, for example, to allow the IR light to hit center region of the sensing area 52, which tends to be the most sensitive area of the sensor. Additionally, the sensor 40 and the emitter 54 can be of different shapes, such as toroidal, pyramidal, etc. It is also possible to reverse the positions of the sensor and emitter by providing a very large emitter upon which a smaller sensor sits. However, since emitters tend to be smaller than sensors, it is preferable to have the emitter sitting on top of the sensor, as illustrated.

The various components of the module can be held together by a variety of methods well known to those skilled in the art. For example, they may be held together by solder, conductive adhesives, non-conductive adhesives, etc. Also, the plastic body, once it has been injected around the assembly, serves to hold the transceiver IC, sensor, and emitter components in position.

Figure 4:
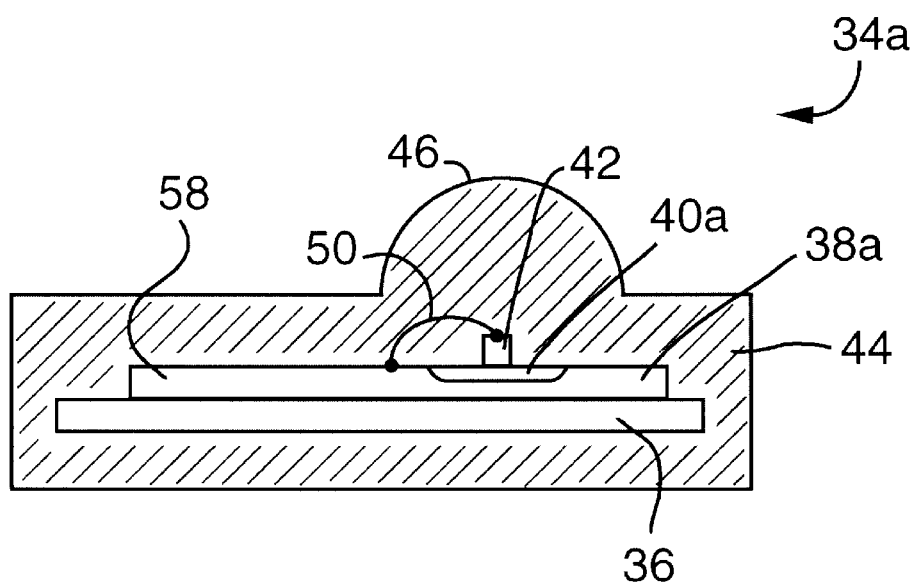
FIG. 4 is a cross-sectional view of a second embodiment of an IR transceiver module in accordance with the present invention.

In FIG. 4, an IR transceiver module 34a includes many of the same elements as described previously with reference to FIG. 3. To the extent that the elements are essentially the same, the same reference numerals will be used. The module 34a includes a lead frame 36, an integrated circuit 58 including a transceiver portion 38a and a sensor portion 40a, and an emitter 42. The emitter 42 can be electrically coupled to the transceiver portion 38a such as by the wire 50. The electrical connections between the transceiver 38a and the sensor 40a are preferably internal to the integrated circuit 58. A unitary plastic body 44 including a lens 46 is aligned with the sensor 40a and emitter 42.

The advantage of the embodiment of FIG. 4 is that it exhibits a higher degree of integration over the functionally similar embodiment of FIG. 3. By making the sensor 40a (again preferably a PIN diode) as part of the integrated circuit 58, the operation of attaching the sensor 40 over the transceiver 38 upper surface is eliminated. In addition, the wiring between the transceiver portion 38a and the sensor portion 40a can be eliminated.

Figure 5:
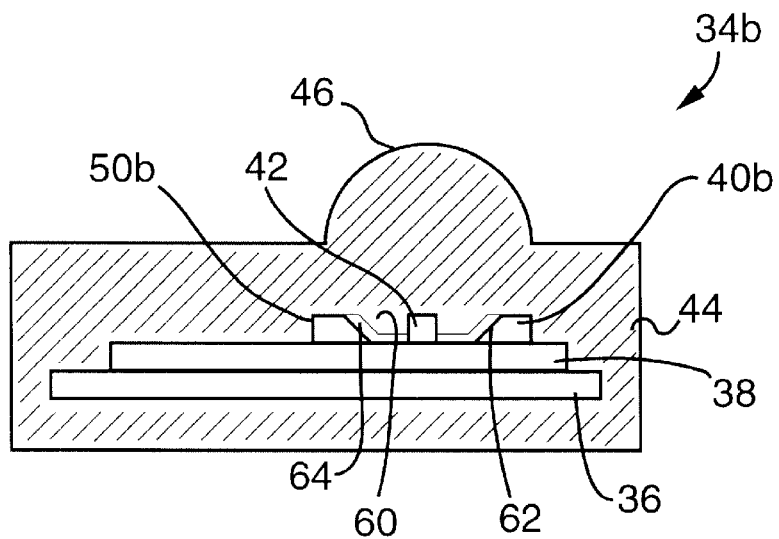
FIG. 5 is a cross-sectional view of a third embodiment of an IR transceiver module in accordance with the present invention.

In FIG. 5, an IR transceiver module 34b again has many points of similarity with the embodiment of FIG. 3, and like reference numerals will be used for like elements. However, the electrical connections between the components will not be shown in this and later discussed embodiments to simplify the drawings and discussion. It will be appreciated, however, that appropriate electrical connections are made, as described with reference to the previous embodiments.

The module 34b includes a lead frame 36, a transceiver 38, and an emitter 42. However, in this embodiment, the sensor 40b has been modified, as discussed below. The lead frame 36, transceiver 38, sensor 40b and emitter 42 are encapsulated with a plastic body 44 including a lens 46.

The sensor 40b, in this embodiment, is modified to include a recess 60 within which the emitter 42 is positioned. The recess 60 includes internal walls 62 coated with a reflective surface 64, which is preferably a metal or a metal alloy. For example, the reflective surface 64 can be aluminum, silver, gold or other metals commonly used in semiconductor manufacturing, the deposition of which is well known to those skilled in the art. The recess 60 can be an inverted, truncated pyramid in shape, a truncated cone, or other shapes derivable by a suitable manufacturing process.

The advantage of this embodiment of an IR transceiver module is that the emitter 42 is provided with a reflective "cup" comprising the reflective surface 64 to direct the light energy out through the lens 46. It should be noted that if a laser emitter 42 were used, this configuration would not be necessary. However, with current IR LEDs, the transmission efficiency of the module 34b is greatly enhanced by the inclusion of the cup formed by the reflective surface 64 on the inner walls 62 of the recess 60. A disadvantage of this design is that the sensing area 50b of the sensor 40b is reduced.

Figure 6:
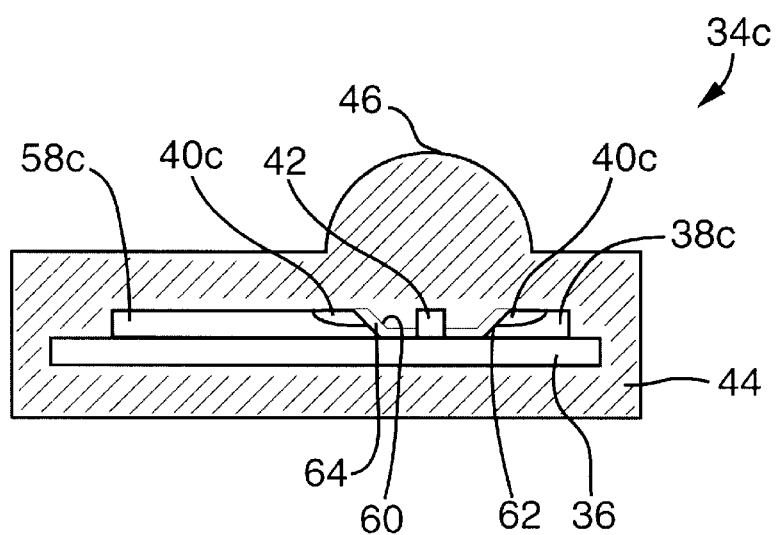
FIG. 6 is a cross-sectional view of a fourth embodiment of an IR transceiver module in accordance with the present invention.

The IR transceiver module 34c shown in FIG. 6 has points of similarity with the embodiments of FIG. 4 and FIG. 5. The module 34c includes a lead frame 36, an integrated circuit 58c, and an emitter 42. The integrated circuit 58c includes a transceiver portion 38c and a sensor portion 40c. A recess 60 is formed in the integrated circuit 58c and the internal walls 62 of the recess 60 are coated with a reflective material 64. This embodiment therefore enjoys many of the advantages of the embodiments of both FIGS. 4 and 5.

Figure 7:
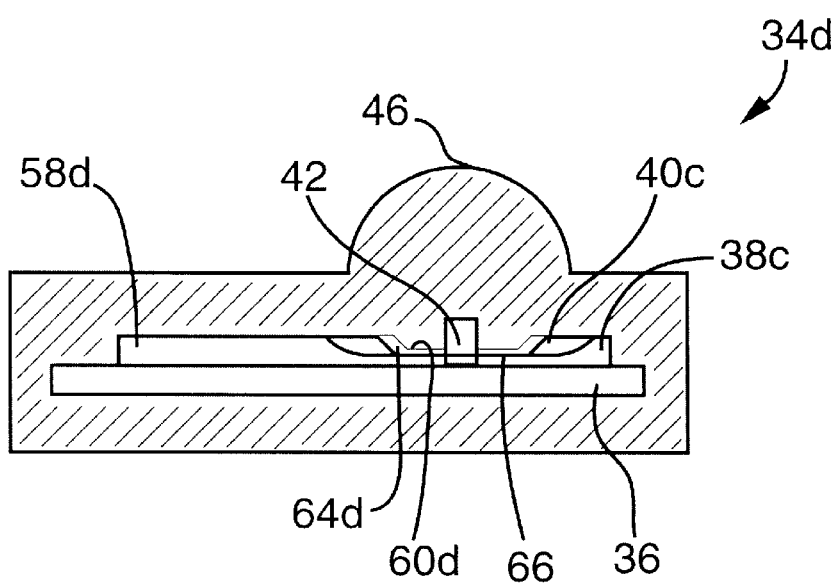
FIG. 7 is a cross-sectional view of a fifth embodiment of an IR transceiver module in accordance with the present invention.

In FIG. 7, an IR transceiver module 34d is very similar to the embodiment shown in FIG. 6. A reflective coating 64d is provided on the inner walls of a recess 60d for the reasons set forth previously. The difference between the embodiment of FIG. 6 and the embodiment of FIG. 7 is that in the embodiment of FIG. 7 the integrated circuit 58d does not have the recess 60d extending fully through its body, as was the case in FIG. 6. In the embodiment of FIG. 6, the emitter 42 can therefore directly "sit" upon the lead frame 36, while in the embodiment of FIG. 7 the emitter 42 sits on the bottom 66 of recess 60d.

Figure 8:
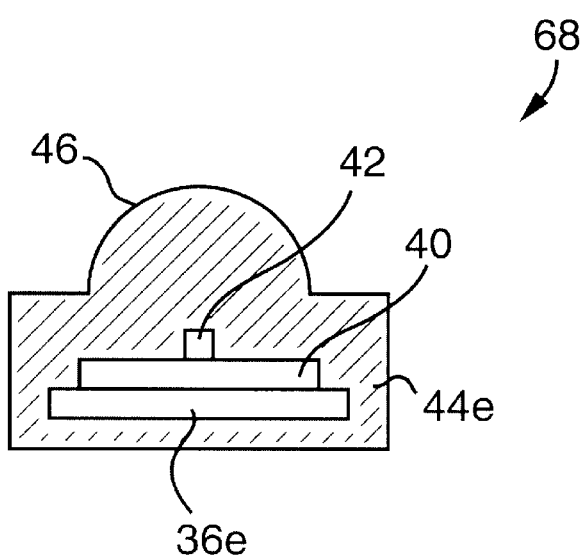
FIG. 8 is a cross-sectional view of a sixth embodiment of an IR transceiver module in accordance with the present invention.

In FIG. 8, an ultra-compact IR transceiver module 68 includes a lead frame 36e, a sensor 40, and an emitter 42 encapsulated within a body 44c having a lens 46. It will be appreciated that a major difference between the embodiment of FIG. 8 and the previous embodiments is the omission of a transceiver IC within the body 44e. Since the transceiver IC tends to add to the size of the body 44e, its omission allows for an ultra-small form factor for the module 68. When using the module 68 of FIG. 8 an external transceiver circuit can used, or separate external receiver and transmitter circuits can be used, as will be appreciated by those skilled in the art.

Figure 9:
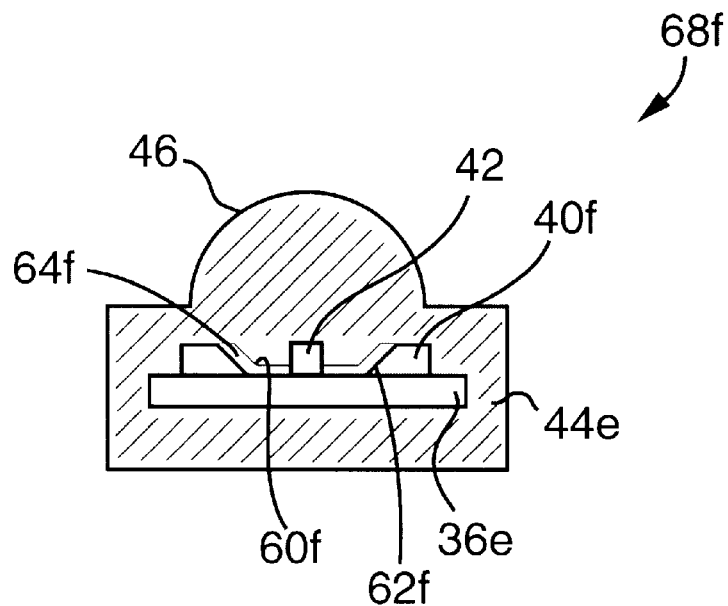
FIG. 9 is a cross-sectional view of a seventh embodiment of an IR transceiver module in accordance with the present invention.

FIG. 9 is similar to the embodiment of FIG. 8 and also to the embodiment of FIG. 5. The module 68f includes a lead frame 36e and an emitter 42, but has a sensor 40f and is provided with a recess 60f having walls 62f covered with a reflective material 64f. As was the case with the embodiment of FIG. 5, the reflective material 64f forms a cup which directs the infrared output of the emitter 42 through the lens 46.

Figure 10:
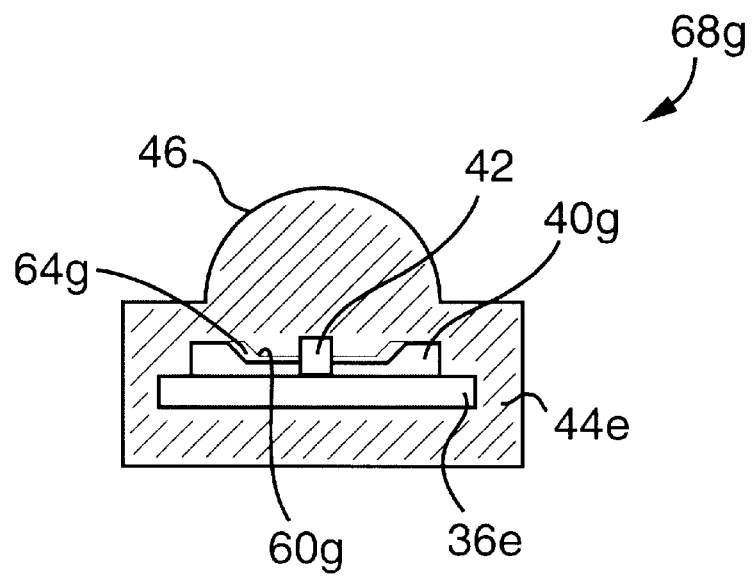
FIG. 10 is a cross-sectional view of a eighth embodiment of an IR transceiver module in accordance with the present invention.

The embodiment of FIG. 10 is similar to the embodiment of FIG. 9. In FIG. 10, a module 68g includes a lead frame 36e and an emitter 42 disposed within a recess 60g of a sensor 40g. The lead frame 36e, the sensor 40g, and the emitter 42 are encapsulated within a body 44e including a lens 46. A major difference between the embodiment of FIG. 10 and the embodiment of FIG. 9 is that the recess 60g does not extend fully through the sensor 40g, as was the case with the recess 60f in the sensor 40f.

Figure 11:
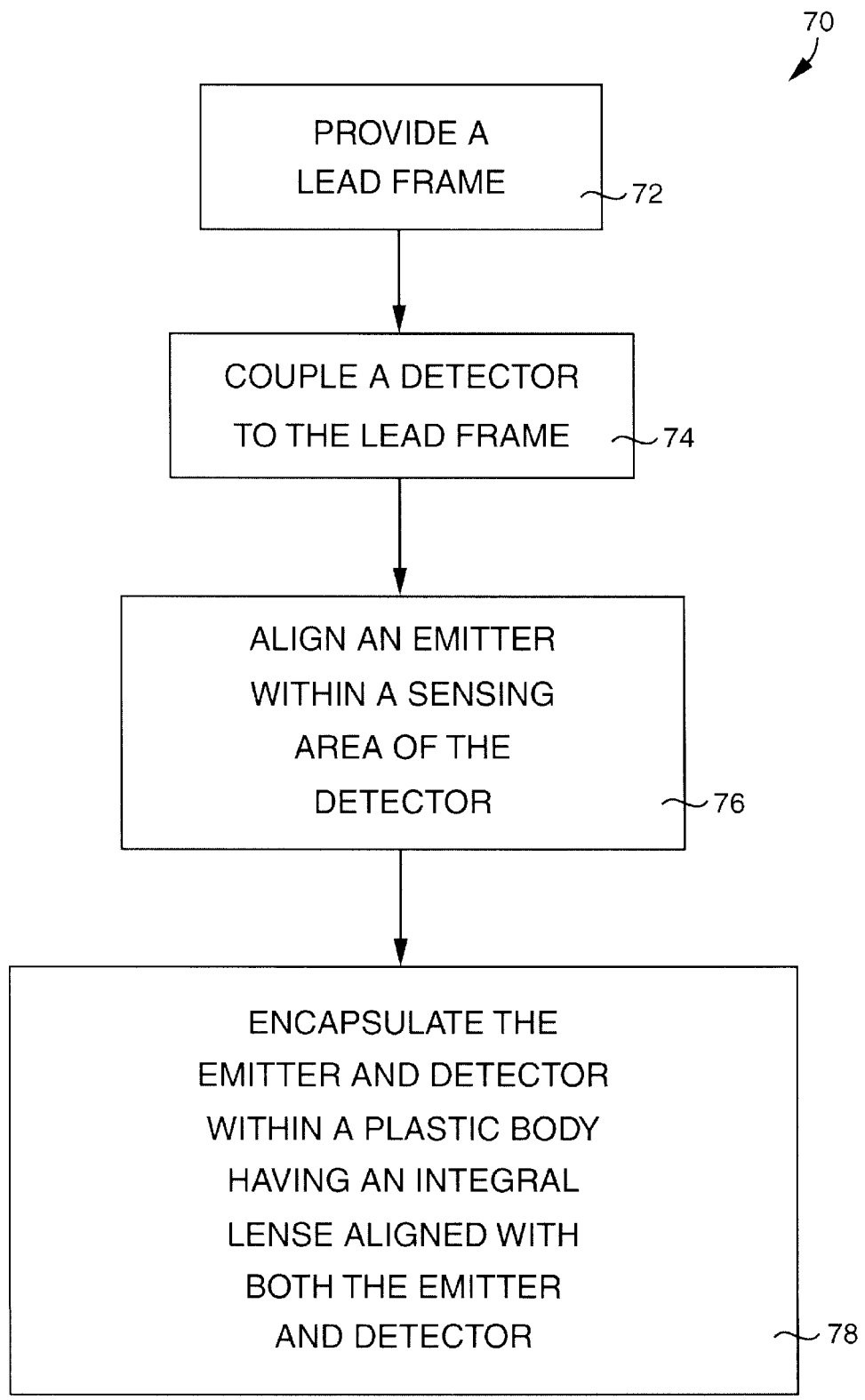
FIG. 11 is a diagram illustrating a method for making an IR transceiver module.

In FIG. 11, a process or method for making a compact IR transceiver module includes an operation 72 of providing a lead frame, an operation 74 of coupling a sensor to the lead frame, an operation 76 of aligning an emitter with a sensing area of the sensor, and an operation 78 of encapsulating the emitter and sensor within a plastic body having an integral lens aligned with both the emitter and sensor.

Figure 12:
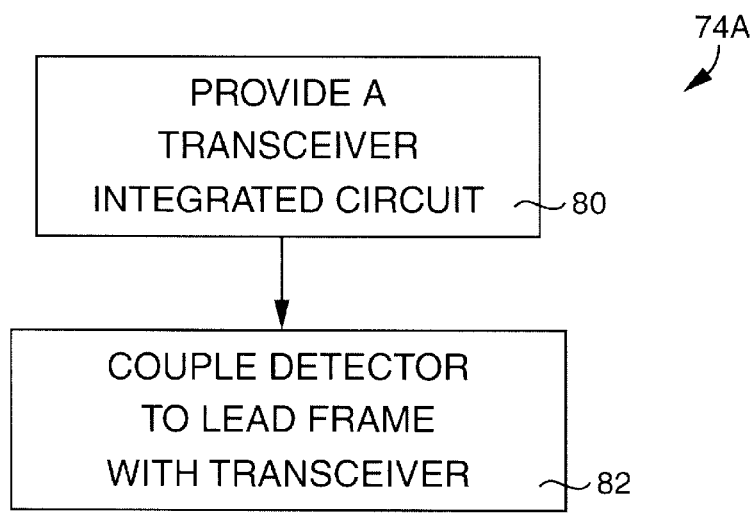
FIG. 12 is an illustration of an embodiment of the operation 74 of FIG. 11.

In FIG. 12, a operation 74a corresponding to an embodiment of the operation 74 of FIG. 11 includes an operation 80 of providing a transceiver integrated circuit and an operation 82 of coupling the sensor to the lead frame with the transceiver. This method applies to the formation of the embodiments of FIGS. 3–7, but not to the embodiments of FIGS. 8–10 which do not include a transceiver IC.

It should be noted that the various components of the present invention can be attached or coupled together in a variety of fashions. For example, conductive and non-conductive glues and solders can be used to couple the lead frame to the transceiver integrated circuit (or directly to the sensor in some embodiments), attach the sensor to the transceiver IC, and to attach the emitter to either the sensor, to the transceiver integrated circuit, or to the lead frame depending on the embodiment. Other forms of bonding and affixing are well known to those skilled in the art. Furthermore, the body 44 itself can be used to stabilize the positions of the various components of the IR transceiver module.

Figure 13:
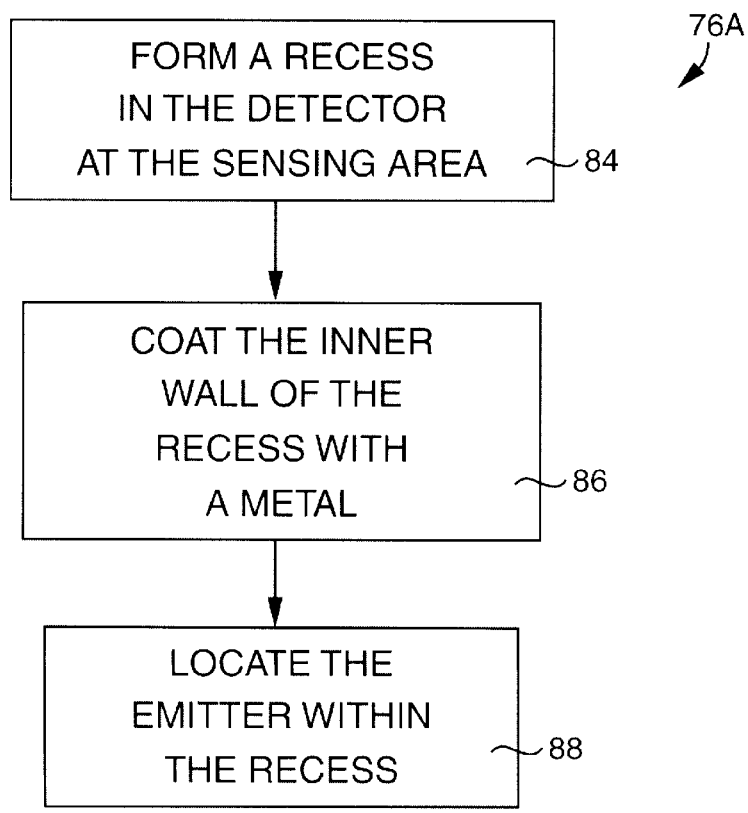
FIG. 13 is an illustration of an embodiment of the operation 76 of FIG. 11.

In FIG. 13, a process or method 76a in accordance with one embodiment of the operation 76 of FIG. 11 is shown. The process 76a begins with the formation of a recess in the sensor at the sensing area in an operation 84. As noted previously, this recess can be formed partially into the sensor or fully through the sensor. A number of different techniques can be used to form the recess including anisotropic and isotropic etching techniques in conjunction with integrated circuit and micro-machine masking techniques well known to those skilled in the art. An operation 86 coats the inner surfaces of the recess with an appropriate reflective metal. Again, metals that may be used in the production of integrated circuits such as aluminum, copper, silver, gold, tungsten, titanium, and alloys thereof (e.g. Al—Cu, TiW) can be used to coat these inner walls. This operation 86 can be performed, for example, by a sputter or CVD-type operation, as will be appreciated by those skilled in the art. Finally, an operation 88 locates the emitter within the recess.

While this invention has been described in terms of several preferred embodiments, it is contemplated that alternatives, modifications, permutations and equivalents thereof will become apparent to those skilled in the art upon a reading of the specification and study of the drawings. For example, while this invention has been described in terms of a module that may not meet IrDA standards, these IrDA standards can be met by modules of the present design by appropriately sizing the lens, sensor, and emitter, and by an appropriate transceiver design. However, as noted previously, there is an inverse relationship between form factor of the modules and the meeting of the IrDA standards.

It is therefore intended that the following appended claims include all such alternatives, modifications, permutations and equivalents as fall within the true spirit and scope of the present invention.

What is claimed is:

1. An IR transceiver module comprising:
a lead frame having a support surface:
a sensor supported proximate said support surface, wherein said sensor is provided with a recess, and wherein said emitter is mounted within said recess;
an emitter supported proximate to said sensor and within a vertical projection of said sensing area of said sensor wherein said emitter is mounted within said sensing area of said sensor;
further comprising a transceiver supported proximate to said support surface and electrically coupled to both said sensor and said emitter, wherein said transceiver is mounted on said support surface; and
a body encapsulating said sensor and said emitter, said body having an integral lens aligned with both said sensing area of said sensor and with said emitter.

2. An IR transceiver module as recited in claim 1 wherein said recess is provided with an IR reflective coating.

3. An IR transceiver module as recited in claim 2 wherein said reflective coating includes an elemental metal or an alloy thereof.

4. An IR transceiver module as recited in claim 3 wherein said elemental metal is selected from the group including aluminum, copper, silver, gold, tungsten, and titanium.

5. An IR transceiver module as recited in claim 1 wherein said recess extends fully through said sensor to said transceiver.

6. An IR transceiver module comprising:
a lead frame having a support surface;
a sensor supported proximate said support surface wherein said sensor is formed integrally with said transceiver, wherein said sensor is provided with a recess, and wherein said emitter is mounted within said recess;
an emitter supported proximate to said sensor and within a vertical projection of said sensing area of said sensor, wherein said emitter is mounted within the sensing area of said sensor; and
a body encapsulating said sensor and said emitter, said body having an integral lens aligned with both said sensing area of said sensor and with said emitter.

7. An IR transceiver module as recited in claim 6 wherein said recess is provided with an IR reflective coating.

8. An IR transceiver module as recited in claim 7 wherein said reflective coating includes an elemental metal or an alloy thereof.

9. An IR transceiver module as recited in claim 8 wherein said elemental metal is selected from the group including aluminum, copper, silver, gold, tungsten, and titanium.

10. An IR transceiver module as recited in claim 6 wherein said recess extends fully through said sensor to said support surface.

11. An IR transceiver module comprising:
a lead frame having a support surface;
a sensor supported proximate said support surface, wherein said sensor is mounted on said support surface, wherein said sensor is provided with a recess, and wherein said emitter is mounted within said recess;
emitter supported proximate to said sensor and within a vertical projection of said sensing area of said sensor, wherein said emitter is mounted within said sensing area of said sensor; and
a body encapsulating said sensor and said emitter, said body having an integral lens aligned with both said sensing area of said sensor and with said emitter.

12. An IR transceiver module as recited in claim 11 wherein said recess is provided with an IR reflective coating.

13. An IR transceiver module as recited in claim 12 wherein said reflective coating includes one of an elemental metal or an alloy thereof.

14. An IR transceiver module as recited in claim 13 wherein said elemental metal is selected from the group including aluminum, copper, silver, gold, tungsten, and titanium.

15. An IR transceiver module as recited in claim 11 wherein said recess extends fully through said sensor to said support surface.

16. A method for making an IR transceiver module comprising:

provia lead frame;

coupling a sensor to said lead frame, said sensor having a sensing area;

disposing an emitter within said sensing area of said sensor;

encapsulating said sensor and emitter within a plastic body provided with an integral lens aligned with both said sensor and said emitter;

forming a recess within said sensor that is receptive to said emitter; and providing an IR reflective coating within said recess.

17. A method for making an IR transceiver module comprising:

providing a lead frame;

coupling a sensor to said lead frame, said sensor having a sensing area;

disposing an emitter within said sensing area of said sensor;

encapsulating said sensor and emitter within a plastic body provided with an integral lens aligned with both said sensor and said emitter;

coupling said sensor to said lead frame with a transceiver:

forming a recess within said sensor that is receptive to said emitter; and providing an IR reflective coating within said recess.

18. A method for making an IR transceiver module as recited in claim 17 further comprising:

forming a recess within said sensor that is receptive to said emitter; and providing an IR reflective coating within said recess.

* * * * *